United States Patent [19]

Friend et al.

[11] Patent Number: 5,523,555
[45] Date of Patent: Jun. 4, 1996

[54] PHOTODETECTOR DEVICE HAVING A SEMICONDUCTIVE CONJUGATED POLYMER

[75] Inventors: Richard H. Friend; Andrew B. Holmes, both of Cambridge; Donal D. C. Bradley, Totley; Robert N. Marks, Cambridge, all of United Kingdom

[73] Assignee: Cambridge Display Technology, Cambridge, United Kingdom

[21] Appl. No.: 305,848

[22] Filed: Sep. 14, 1994

[51] Int. Cl.[6] ................................................. H01J 40/14
[52] U.S. Cl. .................. 250/214 R; 250/214 LA; 250/214 LS; 257/103
[58] Field of Search ............... 250/214 R, 214 LA, 250/214 LS, 214.1, 214 VT; 257/40, 103; 437/1, 225; 313/501, 504, 507; 430/83, 321; 324/766, 767

[56] References Cited

U.S. PATENT DOCUMENTS

| | | | |
|---|---|---|---|
| 4,564,808 | 1/1986 | Faughnan et al. | 324/766 |
| 5,247,190 | 9/1993 | Friend et al. | 257/40 |
| 5,352,906 | 10/1994 | Shinar et al. | 257/103 |

OTHER PUBLICATIONS

"Amorphous Silicon Image Sensor Arrays", M. J. Powell et al., Mat. Res. Soc. Symp. Proc. 258, 1127–1137, Materials Research Society, Jan. 1992.

"Electrical and Optical Characterization of Poly-phenylene-vinylene Light Emitting Diodes", S. Karg, W. Reiss, V. Dyakanov and M. Schwoerer, Synthetic Metals 54, 427–433, Jan. 1993.

"Electroluminesence and Photovoltaic Effect in PPV Schottky Diodes", W. Reiss, S. Karg, V. Dyakanov, M. Meier, M. Schwoerer, Journal of Luminescence 60&61 (Proceedings of the 1993 International Conference on Luminescence 9–13 Aug. 1993), 906–911 (1994).

"Photovoltaic Properties of Poly (p–phenylene vinylene)/ Aluminum Interfaces", H. Antoniadis, B. R. Hsieh, M. A. Abkowitz, M. Stolka and S. A. Jenekhe, Polym. Preprints 34,490, Jan. 1993.

"The Photovoltaic Response in Poly (p–phenylene vinylene) Thin Film Devices", R. N. Marks, J. J. M. Halls, D. D. C. Bradley, R. H. Friend and A. B. Holmes, reported at the Minisymposium on Polymer Light–emitting Diodes, Eindhoven, The Netherlands, 15th Sep. 1993 and published in J. Phys. Condensed Matter 6, 1379–1394 (1994).

"Dual–Function Semiconducting Polymer Devices: Light-–Emitting and Photodetectinhg Diodes", G. Yu, C. Zhang and A. J. Heeger, Appl. Phys. Lett. 64, 1540–1542, 21st Mar. 1994 (1994).

"Semiconducting Polymer Diodes: Large Size, Low Cost Photodetectors with Excellent Visible–Ultraviolet Sensitivity", G. Yu, K. Pakbaz and A. J. Heeger, Appl. Phys. Lett. 64, 10th Jun. 1994 (1994).

*Primary Examiner*—Edward P. Westin
*Assistant Examiner*—Que T. Le
*Attorney, Agent, or Firm*—Merchant, Gould, Smith, Edell, Welter & Schmidt

[57] ABSTRACT

A photodetector device includes a semiconductive conjugated polymer, such as PPV, arranged between first and second electrode layers having different work functions, a bias circuitry connected to apply a bias voltage between the first and second electrode layers, and a sensing circuitry connected to detect a photocurrent flowing between the first and second electrode layers across the polymer layer as a result of radiation incident on the polymer layer while the bias voltage is applied. The bias voltage is selected in relation to the thickness of the polymer layer.

20 Claims, 6 Drawing Sheets

R N MARKS et al

PHOTODETECTOR DEVICE HAVING A SEMICONDUCTIVE CONJUGATED POLYMER

FIELD OF THE INVENTION

This invention relates to a photodetector device, and particularly but not exclusively to a photodetector device capable of operating as an electroluminescent device.

BACKGROUND TO THE INVENTION

It is well known that two-terminal semiconductor diodes can show useful response either when energised by passage of current through the terminals-to produce emission of light (operation as a light-emitting diode, LED), or as photovoltaic (PV) or photoconductive (PC) devices where the current through or voltage across the terminals is varied by the level of light illumination falling on the diode. Among the inorganic semiconductors, devices made with III–V semiconductors have been shown to exhibit both these effects in the 'same device. Among thin-film devices made with molecular semiconductors, both LED and PV or PC behaviour has been observed see for example the LED operation reported by Tang and Van Slyde ("Organic Electroluminescent Diodes", C. W. Tang and S. A. VanSlyde, Appl. Phys. Lett. 51, 913–915 (1987)) and PV operation also report by Tang ("Two-Layer Organic Photovoltaic Cell", C. W. Tang, Appl. Phys. Lett. 48, 183–185 (1986).

Thin-film diodes made with conjugated polymers as the active semiconductor layer have been shown to function as LEDs ("Electroluminescent Devices and Their Manufacture", R. H. Friend, J. H. Burroughes and D.D.C. Bradley, U.S. Pat. No. 5,247,190), and it has also been shown that these same devices can function as PV or PC devices ("Electrical and Optical Characterisation of Poly-phenylene-vinylene Light Emitting Diodes", S. Karg, W. Riess, V. Dyakahoy and M. Schwoerer, Synthetic Metals 54, 427–433 (1993)).

Photodetectors have a large number of applications and are frequently used in an array in which each photodetector can sense radiation incident on it and generate an output signal indicative of the radiation. Such arrays are useful, for example, as image sensors.

Until recently, arrays of photo detectors were constructed by manufacturing a plurality of discrete photodiodes on a substrate to form an array. Recent developments have led to the manufacture of thin film amorphous silicon photodetector arrays for use as large area image sensors. Reference is made to a paper entitled "Amorphous Silicon Image Sensor Arrays", Mat. Res. Soc. Symp. Proc. Vol. 258, 1992, Materials Research Society, for details of an amorphous silicon image sensor.

Such arrays, that use thin film technology on glass substrates, can be used in a wide variety of applications. These include sensors, particularly contact image sensors which can read a document placed directly on top of an array.

The present invention provides an alternative material for use in a photodetector device.

Thin-film devices made with conjugated polymers are of particular interest in that they offer the possibility of fabrication of large-area devices with excellent mechanical and structural properties. Unlike thin-film silicon, which is widely used as a PV diode material, conjugated polymers such as poly(phenylene vinylene) and other such polymers as disclosed in "Electroluminescent Device and Their Manufacture", R. H. Friend, J. H. Burroughes and D.D.C. Bradley, U.S. Pat. No. 5,247,190, can function also as LED devices, and there is particular interest in fabricating structures which simultaneously show useful performance as both LED and PV or PC devices. However, until now, although the LED performance of such devices is sufficiently good to be useful for applications as displays, in respect of efficiency of light emission and colour of emission, the PV performance has been less satisfactory, with quantum efficiencies for PV operation typically 1% and energy efficiencies Of considerably less than 1%. These figures are very much lower than that now achieved for thin-film PV devices based on that inorganic semiconductors such as amorphous silicon. There are several reasons for the low efficiencies of which the difficulty in achieving efficient ionisation of the excitons initially created by photon absorption is probably the most important, though poor electron or hole mobilities are also problematic. Ionisation of excitons which have binding energies significantly above kT, where k is Boltzmanns constant and T is the temperature in ° K.,k can be achieved in the bulk but is often facilitated by the presence of a surface or interface. At a heterojunction between molecular semiconductors with differing electronegativities, ionisation to place electrons in one layer and holes in the other can be arranged to be energetically favoured, and some of the best photovoltaic responses have been obtained from devices of this type.

Conjugated polymers have been tried in photocells at an early stage, but did not produce very promising results, with relatively low open-circuit voltages and low overall efficiencies. Initial efforts were with polyacetylene and some of the polythlophenes. The low open-circuit voltages were attributed in part to the effects of polaron formation, which appear to move one-electron levels deep into the semiconductor gap, so that the energy difference between the energies of the one-electron hole and electron levels can be very much smaller than the $\pi$—$\pi^*$ energy gap. The extreme case is that of trans-polyacetylene, where the excitations take the form of solitons with non-bonding levels at mid-gap, and which can be either positively or negatively charged, so that the one-electron levels for electrons and holes are coincident. The chemical potential for these carriers must also take the lattice polarisation into account, so that larger photovoltages can be produced.

SUMMARY OF THE INVENTION

The present inventors have discovered that the photoconductive efficiencies of such diodes when biased either in forward (i.e. towards LED operation) or reverse, can reach unexpectedly high values, exceeding 500% electrons collected per photon incident.

According to the present invention in one aspect there is provided a photodetector device comprising:

a semiconductive conjugated polymer layer arranged between first and second electrode layers having different work functions;

bias circuitry connected to apply a bias voltage between said first and second electrode layers; and sensing circuitry connected to detect a photocurrent flowing between said first and second electrode layers across said polymer layer as a result of radiation incident on said polymer layer while said bias voltage is applied, said bias voltage being selected so that the quantum efficiency of the device exceeds 30%.

According to another aspect of the invention there is provided method of detecting radiation comprising the steps of:

applying a bias voltage to first and second electrode layers having different work functions and between which is arranged a semiconductive conjugated polymer layer;

directing radiation to be detected onto said polymer layer while said bias voltage is applied; and sensing a photo-current flowing between said first and second electrode layers across said polymer layer, wherein the bias voltage is selected so that the quantum efficiency of the device exceeds 30%.

According to a further aspect of the invention there provided a method of using an electroluminescent device as photodetector, the electroluminescent device comprising:

a semiconductive conjugated polymer layer;

a first contact layer arranged on one side of the semiconductive conjugated polymer layer selected so that on application of an electric field to said device charge carriers of a first type are injected into the semiconductive conjugated polymer layer; and a second contact layer arranged on the other side of the semiconductive conjugated polymer layer selected so that on application of an electric field to said device charge carriers of a second type are injected into the semiconductive conjugated polymer layer, the semiconductive conjugated polymer layer having a sufficiently low concentration of extrinsic charge carriers that on applying an electric field between the first and second contact layers so as to render the second contact layer positive relative to the first contact layer, charge carriers of said first and second types are injected into the semiconductive conjugated polymer layer and combine to form charge carrier pairs which decay radiatively so that radiation is emitted from said semiconductive conjugated polymer layer, said method comprising:

applying a bias voltage between the first and second contact layers while directing radiation onto said semiconductive conjugated polymer layer and sensing a photo-current flowing in said device as a result of said radiation, wherein the bias voltage is selected so that the quantum efficiency of the device exceeds 30%.

The bias voltage can be applied in the forward direction (positive voltage to the electrode with the highest work function) or in the reverse direction.

The inventors have found that at a given light intensity incident onto the polymer layer, the magnitude of the photo-current increases rapidly with increasing bias voltage in either the forward or reverse direction.

In particular, for bias voltages giving rise to an electric field of greater than $10^5$ Vcm$^{-1}$ quantum efficiencies rise rapidly and can reach levels above 30%. Quantum efficiencies of 70% and above can be achieved. Quantum efficiencies rise further and can reach even higher levels for an electric field in excess of $2.5 \times 10^5$ vcm$^{-1}$.

The term quantum efficiency is used herein to denote the ratio of electrons collected to photons incident on the polymer layer and is measured in practice by measuring the photo-current flux and photon flux of applied radiation.

Photodetectors using amorphous silicon technology have efficiencies of the order of 70%. The inventors have demonstrated efficiencies for semiconductive conjugated polymer devices of a similar order and higher. As already mentioned, semiconductive conjugated polymers have processability advantages over amorphous silicon which renders them more attractive for thin film devices.

The discovery of electroluminescence in conjugated polymers such as PPV, which results from capture of positive and negative polarons to form singlet excitons which then decay radiatively, has led the present inventors to re-examine the energetics of polaron formation in these polymers and their application as photodetectors. In particular, the singlet exciton emission is close to the onset of $\pi$—$\pi^*$ absorption and since this exciton is created from positive and negative polarons, the free energy of these two charged states cannot be much smaller than that of the singlet exciton.

PPV can be conveniently processed via a soluble precursor polymer to form thin films of high uniformity and together with its relatively high luminescence efficiency, it has provided the material Of reference for work on polymer LEDs. The first $\pi$—$\pi^*$ optical absorption is just below 2.5 eV, and the balance of evidence indicates that it is due to the (0.0) vibronic transition to the vibrational ground-state of the singlet exciton. Photoluminescence from the radiative decay of the singlet exciton appears at the (0.0) transition just below the $\pi$—$\pi^*$ absorption edge, and in a series of vibronic bands red-shifted from the (0.0) emission. Photoexcitation from $\pi$ to $\pi^*$ states results primarily in the formation of intra-chain singlet excitons, but the formation of triplet excitons is also seen and there is evidence from optically-detected magnetic resonance experiments for the transient presence of spin ½ charged excitations which later produce singlet exciton emission, by electron-hole capture to re-form the singlet exciton. Generation of charged excited states can be observed by measurements of photoconductivity. For measurements with current flow within the plane of the polymer film, the steady-state photocurrent shows a sub-linear dependence on light intensity, indicating that there is bimolecular recombination of positive and negative charges. The spectral dependence of the photoconductivity shows a strong onset at the $\pi$—$\pi^*$ absorption edge at 2.5 eV, and increases at higher photon energies for thin samples. For thicker samples the action spectrum peaks close to this onset, at the wavelength where photon absorption occurs through the full thickness of the sample. Further into the absorption edge as the absorption depth falls well below the film thickness, the photocurrent falls on account of increased bimolecular recombination. These results have been taken to indicate that photogeneration of carriers in PPV occurs principally in the bulk.

In the described embodiment, the photodetectors are formed with thin films (100 nm) of the semiconductive conjugated polymer poly(p-phenylene vinylone) (PPV) between electrodes of indium/tin oxide (ITO) and either aluminium, magnesium or calcium.

In another embodiment, the conjugated polymer is PPV and one of the contact layers is non-crystalline silicon and the other of the contact layers is selected from the group consisting of aluminium, gold, magnesium/silver alloy and indium oxide.

These embodiments can be made by putting down either the first electrode layer or the second electrode layer onto a substrate, applying a thin film of PPV and then putting down the other of the first and second electrode layers.

Preferably the polymer film is of substantially uniform thickness in the range 10 nm to 5 µm and the conjugated polymer has a semiconductor bandgap in the range 1 eV to 3.5 eV. The preferred thickness for devices is in the range 50 nm to 320 nm, and particularly about 100 nm. Furthermore the proportion of the conjugated polymer in the active areas of the polymer film is sufficient to achieve the percolation threshold for charge transport in the conjugated polymer present in the film.

Another aspect of the present invention provides a method of manufacturing a photodetector device comprising a layer of semiconductive conjugated polymer between first and second electrode layers, comprising the steps a) putting down one of said first and second electrode layers;

b) depositing on said electrode layer a layer of semiconductive conjugated polymer;

c) providing the other one of said first and second electrode layers; and d) connecting to said first and second electrode layers circuitry for generating a bias voltage and sensing a photo-current when the device is illuminated, wherein the bias voltage is selected so that the quantum efficiency of the device exceeds 30%.

By conjugated polymer is meant a polymer which possesses a delocalised π-electron system along the polymer backbone; the delocalised π-electron system confers semiconducting properties to the polymer and gives it the ability to support positive and negative charge carriers with high mobilities along the polymer chain. Such polymers are discussed for example by R. H. Friend in Journal of Molecular Electronics 4 (1988) January-March, No. 1, pages 37 to 46. The application of these polymers to electroluminescent devices is set forward in our above-referenced U.S. Pat. No. 5,247,190.

In order to produce the desired combined electroluminescent/ photovoltaic effects, the polymer film must be substantially free of defects which act as non-radiative recombination centres, since such defects prevent electroluminescence.

By "dense" polymer film is meant that the polymer film is not fibrillar and is substantially free of voids.

The film of conjugated polymer preferably comprises a single conjugated polymer or a single co-polymer which contains segments of conjugated polymer. Alternatively, the film of conjugated polymer may consist of a blend of a conjugated polymer or copolymer with another suitable polymer.

Further preferred features of the polymer film are that:

i) the polymer should be stable to oxygen, moisture, and to exposure to elevated temperatures;

ii) the polymer film should have good adhesion to an underlying layer, good resistance to thermally-induced and stress-induced cracking, and good resistance to shrinkage, swelling, recrystallisation or other morphological changes;

iii) the polymer film should be resilient to ion-atomic migration processes, e.g. by virtue of a high crystallinity and high melting temperature.

The film of conjugated polymer is preferably a film of a poly(p-phenylene vinylene) (PPV) of formula

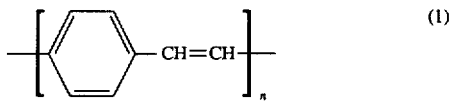
(1)

wherein the phenylene ring may optionally carry one or more substituents each independently selected from alkyl (preferably methyl), alkoxy (preferably methoxy or ethoxy), halogen (preferably chlorine or bromine), or nitro.

Other conjugated polymers derived from poly(p-phenylene vinylene) are also suitable for use as the polymer film in the devices of the present invention. Typical examples of such derivatives are polymers derived by:

i) replacing the phenylene ring in formula (I) with a fused ring system, e.g. replacing the phenylene ring with an anthracene or naphthalene ring system to give structures such as:

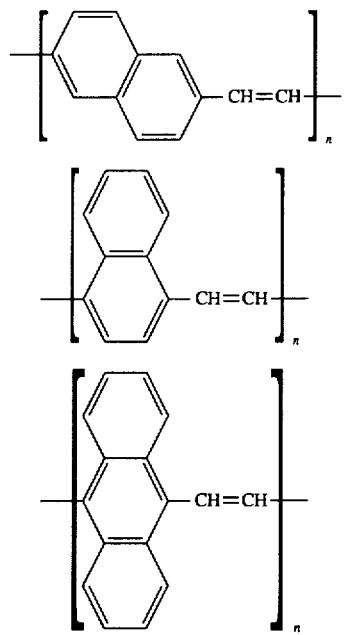

These alternative ring systems may also carry one or more substituents of the type described above in relation to the phenylene ring.

ii) replacing the phenylene ring with a heterocyclic ring system such as a furan ring to give structures such as:

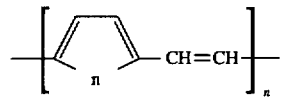

As before, the furan ring may carry one or more substituents of the type described above in relation to phenylene rings.

iii) increasing the number of vinylene moieties associated with each phenylene ring (or each of the other alternative ring systems described above in i) and ii)) to give structures such as:

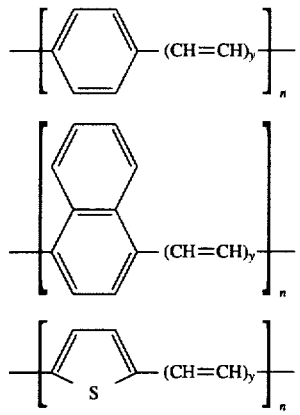

wherein y represents 2, 3, 4, 5, 6, 7, . . . .

Once again, the ring systems may carry the various substituents described above.

The film of conjugated polymer may be prepared by means of a chemical end/or thermal treatment of a solution—processible or melt-processible "precursor" polymer. The latter can be purified or pre-processed into the desired form before subsequent transformation to the conjugated polymer via an elimination reaction.

Films of the various derivatives of PPV described above can be applied onto a conducting substrate in similar manner by using an appropriate sulphonium precursor.

In certain circumstances it may be advantageous to use polymer precursors which have a higher solubility in organic solvents than the sulphonium salt precursors (III). Enhanced solubility in organic solvents can be achieved by replacing the sulphonium moiety in the precursor by a less hydrophilic group such as an alkoxy group (usually methoxy), or a pyridinium group.

Typically, a film of Poly(Phenylenevinylene) is applied onto a conducting substrate by a method which relies on a reaction scheme such as it illustrated in FIG. 13. The sulphonium salt monomer (II) is converted into e precursor polymer (III) in aqueous solution or in a solution of methanol/water, or methanol. Such a solution of the precursor polymer (III) can be applied onto a conducting substrate by means of standard spin-coating techniques as used in the semiconductor industry for photoresist processing. The resultant film of precursor-polymer III can then be converted into poly(phenylene vinylene) (I) by heating to temperatures typically in the range 200°–350° C.

Details of the conditions necessary for the chemical synthesis of the monomer (II), its polymerisation to the precursor (III) and its thermal conversion to PPV are described in the literature, for example in D.D.C. Bradley, J. Phys. D (Applied Physics) 20, 1389 (1987); and J. D. Stenger Smith, R. W. Lenz and G. Wegner, Polymer 30, 1048 (1989).

We have found that with poly(phenylenevinylene) films of a thickness in the range 10 nm to 10 micrometres can be obtained. These PPV films are found to have very few pin holes. The PPV film has a semiconductor energy gap of about 2.5 ev (500 nm); it is robust, shows little reaction with oxygen at room temperature, and is stable out of air at temperatures well in excess of 300° C.

Enhanced ordering in the conjugated material may be achieved by modifying the leaving group of the precursor polymer to ensure that the elimination proceeds smoothly via a simple reaction without generation of additional intermediate structure. Thus, for example, the normal dialkyl sylphonium moiety can be replaced with a tetrahydrothiophenium moiety. The latter eliminates as a single leaving group without decomposition, as is seen for dialkyl sulphide, into an alkyl mercaptan.

A further material which may be suitable for forming the film conjugated polymer is poly(phenylene).

This material may be prepared by starting from biologically synthesised derivatives of 5,6-dihydroxycyclohexa-1, 3-dienes. These derivatives can be polymerised by use of radical initiators into a polymer precursor that is soluble in simple organic solvents. This preparation of poly(phenylene) is more fully described in Ballard et al, J. Chem. Soc. Chem. Comm. 954 (1983).

A solution of the polymer precursor can be spin coated as a thin film onto a conducting substrate and then be converted to the conjugated poly(phenylene) polymer by a heat treatment, typically in the range 140° to 240° C.

Copolymerisation with vinyl or diane monomers can also be performed so as to obtain phenylene copolymers.

A further category of materials which can be used to form the required film of conjugated polymer is a conjugated polymer which is itself either solution processible or melt processible by virtue of the presence of bulky pendant side groups attached to the main conjugated chain or by virtue of the inclusion of the conjugated polymer into a copolymer structure of which one or more components are non-conjugated. Examples of the former include:

a) Poly(4,4'-diphenylenediphenylvinylene) (PDPV) is an arylene vinylone polymer in which both vinylone carbons are substituted by phenyl rings. It is soluble in common organic solvents thus enabling the preparation of thin films.

b) Poly(1,4-phenylene-1-phenylvinylene) and poly(1,4-phenylenediphenylvinylene) polymers are analogues of PPV in which respectively one and both vinylone carbons are substituted with phenyl groups. They are both soluble in organic solvents and may be cast or spun into thin film form.

c) Poly(3-alkylthiophene) polymers (alkyl is one of propyl, buryl, pentyl, hexyl, heptyl, octyl, decyl, undecyl, dodecyl, etc.) which are solution processible in common organic solvents and which for longer alkyl sequences (alkyl greater than or equal to octyl) are also melt processible.

d) Poly(3-alkylpyrrole) polymers which are expected to be similar to the poly(3-alkylthiophene) polymers.

e) poly(2,5-dialkoxy-p-phenylenevinylene) polymers with akyl greater than butyl are solution processible.

f) Poly(phenylacetylene) is a derivative of polyacetylene in which the hydrogen atoms along the chain are replaced by phenyl groups. This substitution renders the material soluble.

For a better understanding of the present invention and to show how the same may be carried into effect, reference will now be made by way of example to the accompanying drawings.

DESCRIPTION OF THE PREFERRED EMBODIMENTS

Figure 1:
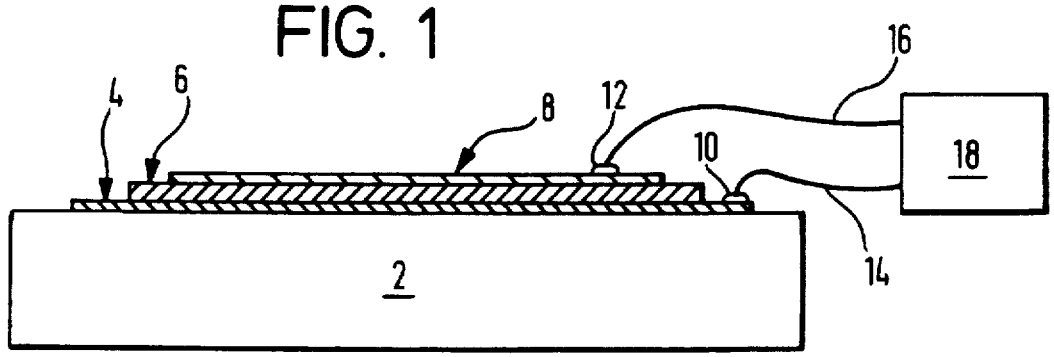
FIG. 1 is a schematic diagram of the structure of a photodetector/electroluminescent device.

FIG. 1 illustrates a structure which can operate as a photodetector or electroluminescent device according to one embodiment of the present invention. The structure comprises a glass substrate 2 on which lies an electrode layer 4 of indium tin oxide. On top of that is a thin film layer 6 of PPV on which is a second electrode layer 8 of aluminium, magnesium or calcium. Contacts 10, 12 are applied to the first and second electrodes 4, 8 respectively and connected by wires 14,16 to an external circuit 18 which is capable of applying a bias voltage between the first and second electrodes and detecting a photocurrent flowing through the device as a result of illumination of the device under the application of a bias. Indium tin oxide has a higher work function than Al, Mg or Ca and so the device is in forward bias when a positive voltage is applied to the ITO electrode 4.

Current-Voltage Characteristics

Figure 2:
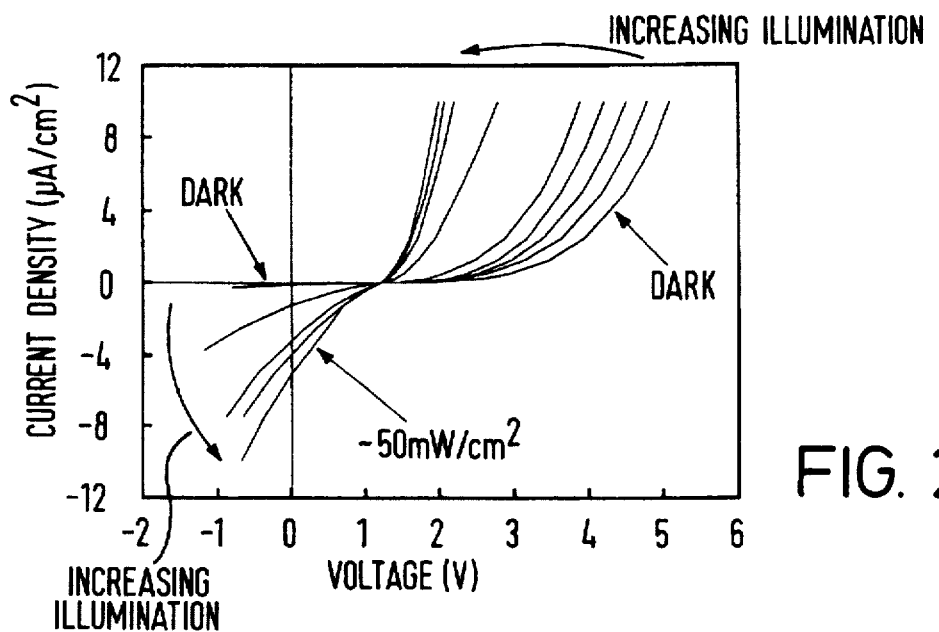
FIG. 2 is a graph of I–V curves for an ITO-PPV-Mg device with a PPV layer of thickness 1200 A illuminated by 496 nm radiation from an Ar+laser.
Figure 3:
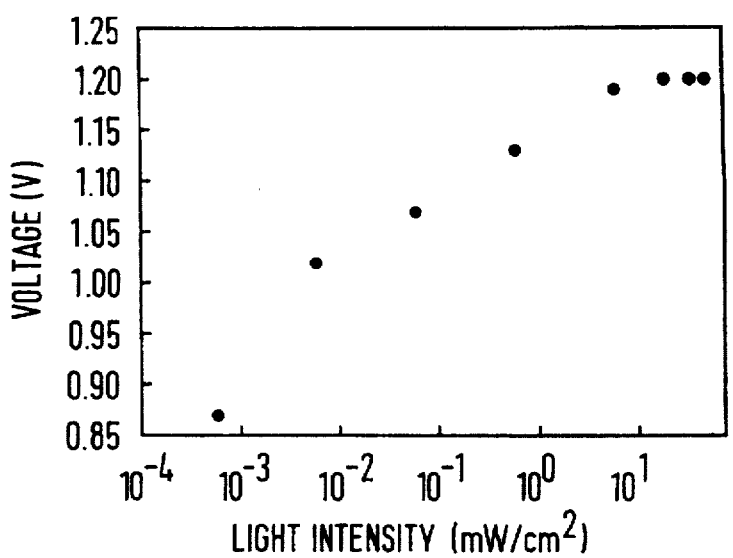
FIG. 3 is a graph of the open circuit voltage developed across the device of FIG. 1 is a function of incident intensity.

Current-voltage (I/V) characteristics of an ITO-PPV-Mg diode, (PPV layer of thickness 120 nm), in the dark and under laser illumination at 496 nm are shown in FIG. 2. The device is strongly rectifying in the dark, but under illumination a substantial open circuit voltage is observed, and current flow is enhanced in both forward (ITO held positive) and reverse bias. The open circuit voltage of this device is plotted as a function of incident intensity in FIG. 3, where it can be seen that the voltage rises steeply at low intensities before saturating at around 1.2 V. The I/V characteristics of devices made with Al and Ca were qualitatively similar, and the maximum photovoltages obtained are listed in Table 1 (overleaf).

As the field inside the PPV rises with applied bias voltage, the current through the device rises well above the dark current, both in forward and reverse bias. As evident from FIG. 2, the photocurrent rises increasingly rapidly with

TABLE 1

The expected and measured maximum photovoltages obtained with ITO-PPV-metal photovoltaic devices.

| Metal contact used | Measured maximum photovoltage (V) | Metal work function (eV) | Difference in work function with respect to ITO (V) |
|---|---|---|---|
| Aluminium | 1.2 | 4.28 | 0.5 |
| Magnesium | 1.2 | 3.66 | 1.2 |
| Calcium | 1.7 | 2.87 | 1.9 |

To illustrate the enhanced photodetector effect under bias discovered by the present inventors and underlying the present invention various experiments have been carried out as discussed in more detail in the following.

PPV films of thickness of order 100 nm were prepared via the sulphonium salt precursor route, by spin-coating films of the precursor polymer from solution in methanol onto the ITO-coated glass substrates. Conversion to PPV was achieved by heating in vacuo at 250° C. for four hours. Top metal contacts 10, 12 were subsequently deposited by thermal evaporation. Al and Mg devices were made with an active area of 2 mm$^2$, and a Ca device 1 mm$^2$. Handling of the calcium devices was carried out in a glove box, prior to encapsulation with an epoxy resin to prevent corrosion in air.

The diodes were mounted in a continuous flow helium cryostat provided with optical windows. For measurements of the current-voltage characteristics the devices were illuminated by light, from the ITO side unless otherwise stated, from an argon ion laser at either 457.9 nm or 496.5 nm, and the intensity was controlled with neutral density filters. A Keithlay 230 voltage source was used to drive the devices, and a Keithlay 617 electrometer monitored the current through the device by measuring the voltage across a shunt resistor which was chosen to be small compared with the device resistance at that bias.

Figure 4:
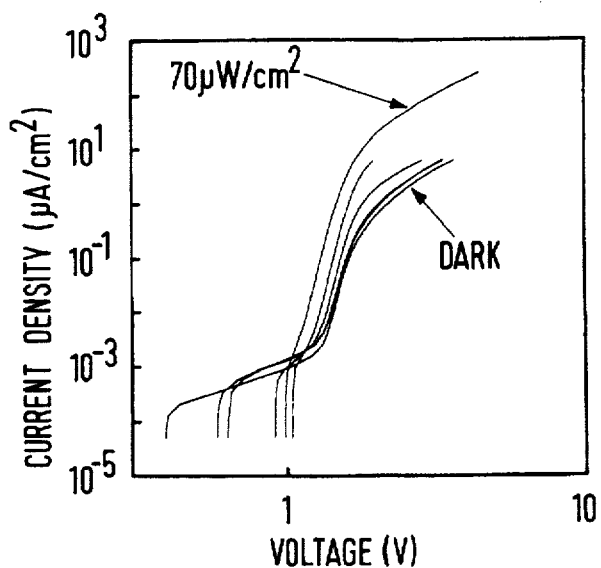
FIG. 4 shows I–V curves of an ITO-PPV-Mg device at high forward bias, illuminated at 496 nm.
Figure 5:
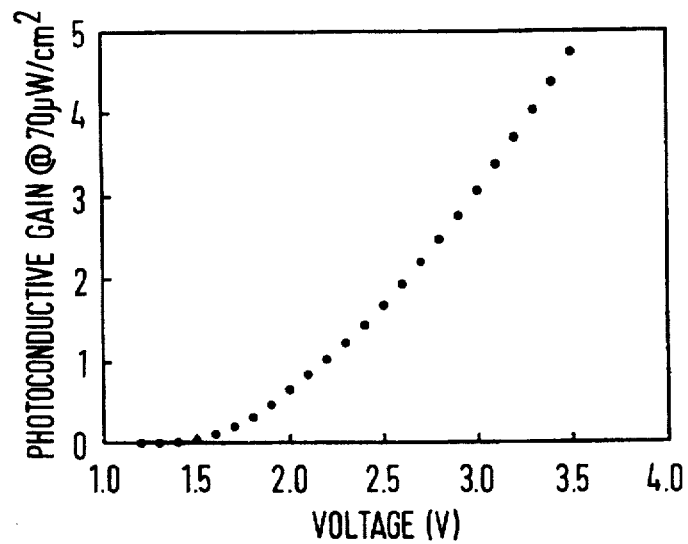
FIG. 5 shows the variation in photoconductive gain with bias voltage at an incident photo flux of 70 µW/cm$^{-2}$.

Measurements of the spectral response were made by illuminating the diodes with light from a tungsten lamp source, passed through a Chromex 250/500 monochromator. The circuit mentioned above was used to bias the sample. These measurements were corrected for the response of the lamp/monochromator system, by measuring the spectral response of a silicon photodiode placed in the sample position.

magnitude of bias and shows no tendency to saturation. Comparable effects are seen for both forward and reverse bias. This is shown very Clearly in the I/V characteristics under strong forward bias, as shown for an ITO-PPV-Mg device (PPV layer thickness 220 nm) in FIG. 4. The photoconductive gain is defined as the ratio of the number of charges collected in the external circuit to photons incident on the device, and the gain at an incident photon flux of 70 $\mu W/cm^2$ is shown in FIG. 5. This rises to values greater than unity, which requires that the lifetime of the photocarriers is greater than their transit time across the device, so that each carrier can make several effective crossings of the PPV layer. It will readily be understood by reference to FIG. 2 that results comparable to those illustrated in FIGS. 4 and 5 for high forward bias voltages are also achieved for high reverse bias voltages. With reference to FIG. 5 it can be noted that a quantum efficiency of 70% is achieved at a voltage of 2.0 V, i.e. an electric field of about $1.7 \times 10^5$ Vcm$^{-1}$. At an electric field of $2.5 \times 10^5$ Vcm$^{-1}$ a bias voltage of 3 V, the efficiency has increased to 300%.

Figure 6:
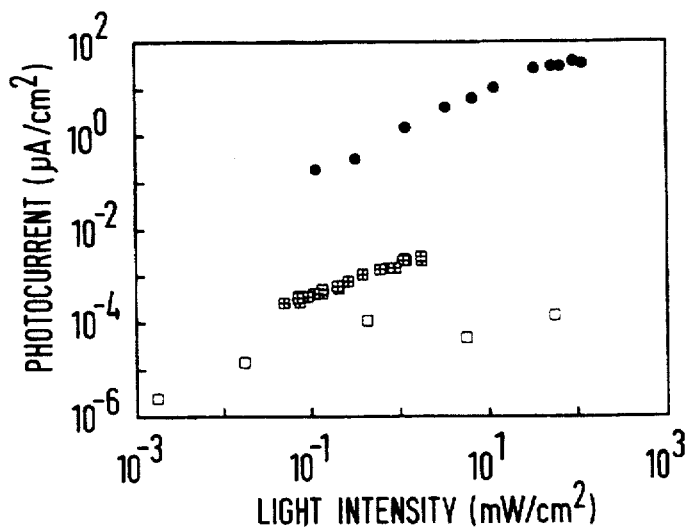
FIG. 6 shows the short circuit current of ITO-PPV-metal diodes in which the open squares are ITO-PPV(110 nm)-Al, the filled circles are ITO-PPV(50 nm)-Mg and the hatched squares are ITo-PPV(320 nm)-Ca.

The variation of the short-circuit current with intensity for devices with aluminium, magnesium, and calcium contacts is illustrated in FIG. 6 for excitation at 457.9 nm. The photocurrent for the three devices follows an approximately sublinear power law, with an exponent of around 0.8 at high intensities. The PPV layer thicknesses for the Al, Mg, and Ca devices were 110, 50, and 320 nm respectively, and the variation in efficiency between these devices is probably due to the differing polymer layer thicknesses. The quantum yield, defined as the ratio of the measured short-circuit photocurrent to the estimated photon flux incident on the diode was measured for a range of devices. System calibration was made by replacing the PPV photodiode with a silicon photodiode of known efficiency, but no corrections were made for reflectivity at the device interface. Quantum yields for devices made with Mg as the electronegative electrode, were found to vary systematically with the thickness of the PPV layer, with typical values of 1% for PPV layers of thickness 50 nm, and 0.5% at 90 nm., for power levels of 0.1 mw/cm². These quantum efficiencies were measured under short circuit conditions, i.e. at a bias voltage of zero volts.

Spectral Dependence

Figure 7:
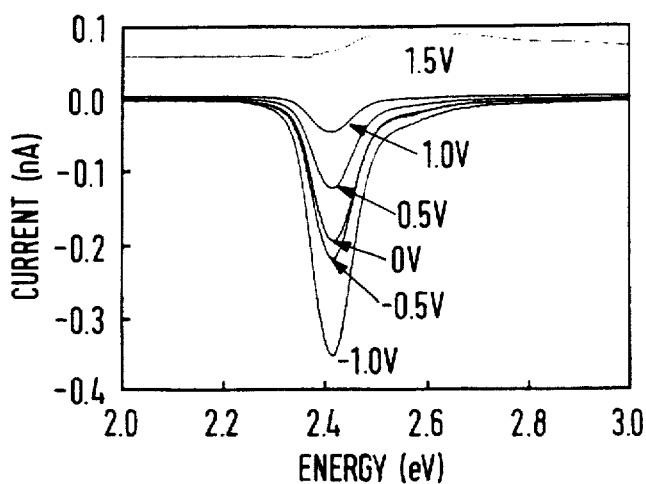
FIG. 7 shows the spectral response of the current through an ITO-PPV-Mg diode with the PPV layer thickness 200 nm for a range of applied voltages and a total device thickness of 220 nm.
Figure 8:
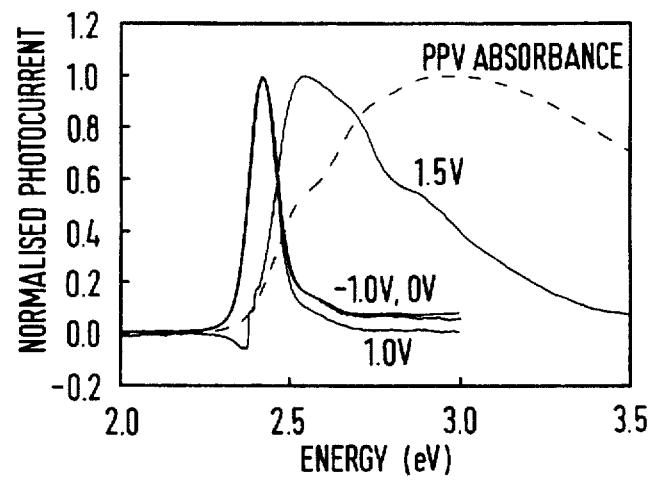
FIG. 8 shows the data of FIG. 7 after correction for dark current, light source and monochrometer response and normalization to a common peak value.

The spectral response of the current for an ITO-PPV-Mg device with a relatively thick layer of PPV (220 nm) is shown in FIG. 7 at biases between −1.0 V and +1.5 V. No correction has been made for the response of the light source and monochromator, or for reflectance from the device. The spectra show a sharp peak at the onset of the optical gap (about 2.5 eV), and a more shallow tail at higher photon energies. Between 1.0 and 1.5 V the polarity of the photocurrent reverses, which indicates that the polarity of the electric field inside the device has reversed between these voltages. This is consistent with the open circuit voltage for magnesium diodes of 1.2 V shown in FIG. 3. FIG. 8 shows the same data, after the dark current has been subtracted, the photocurrent corrected for the lamp-monochromator response, and the peak photocurrent normalised to unity. The broken curve is the normalised absorption spectrum of PPV, shown for comparison. The spectral response at 1.0 V and below is independent of field, although its magnitude varies by an order of magnitude as shown in FIG. 7. However, the response at 1.5 V is very different; the peak energy is blue-shifted, and the high energy photon response is much improved.

Figure 9:
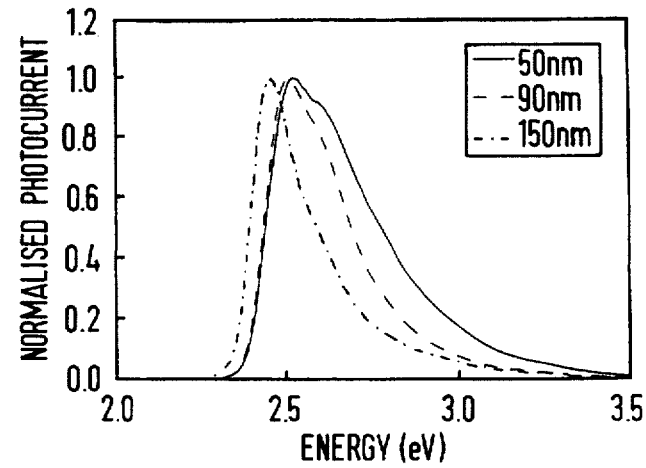
FIG. 9 shows the spectral response of ITO-PPV-Mg diodes with different PPV layer thicknesses.
Figure 10:
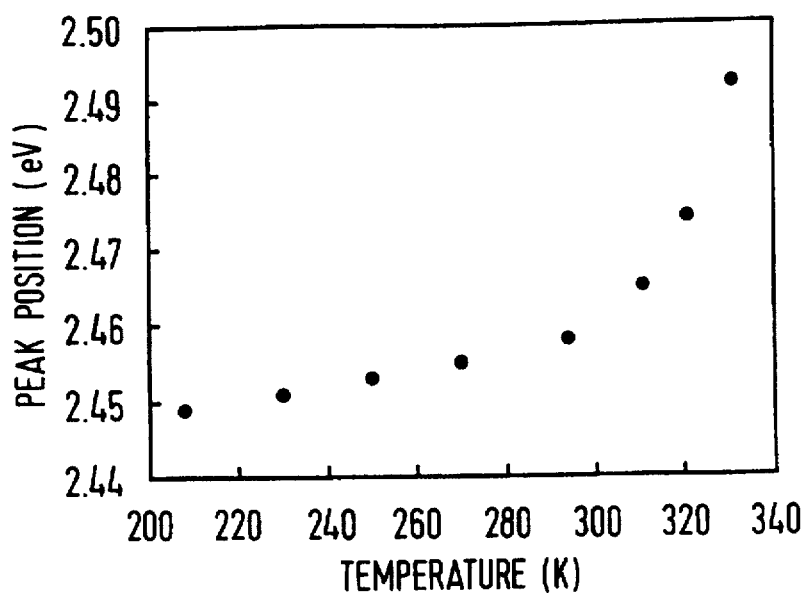
FIG. 10 shows photon energy at the peak of the photovoltaic response shown as a function of the device temperature.

The spectral response of the short-circuit current was measured for devices with a range of PPV layer thicknesses, as is shown in FIG. 9. The data were taken at room temperature, and were normalised according to the procedure used for the 220 nm thick device shown in FIG. 8. The peak broadens and shifts to higher photon energies as the thickness of the PPV film decreases. The spectral response of the short-circuit current is fairly insensitive to temperature below about 300 K, but above this temperature the peak position shifts to a higher energy and the peak broadens. The energy of the peak position is plotted against temperature in FIG. 10.

Figure 11:
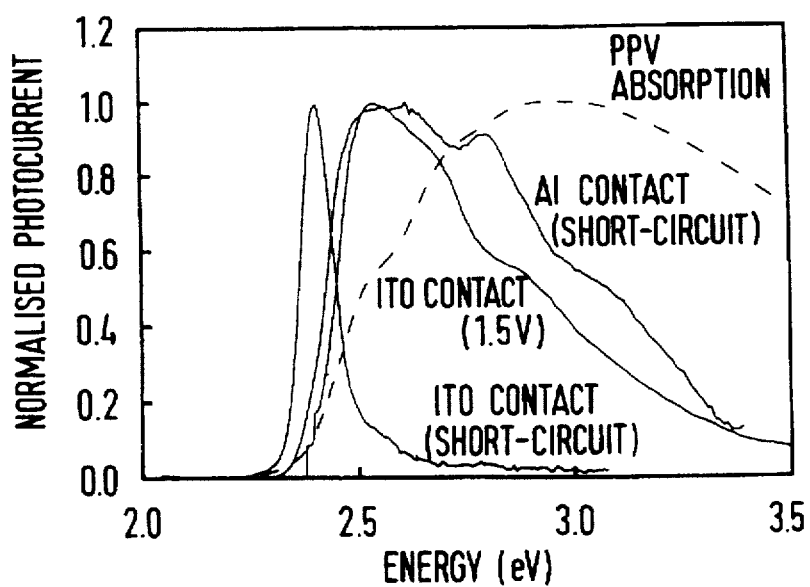
FIG. 11 is a comparison between the spectral response of an ITO-PPV-Al diode when illuminated through the ITO layer and the semi-transparent Al contact.

An ITO-PPV-Al device was constructed with a semi-transparent aluminium contact so that the device could be illuminated from either side of the sample. The aluminium layer showed a transmittance of approximately 50%. FIG. 11 compares the spectral response of the diode current when illuminated through the ITO in short-circuit and with 1.5 V applied bias, and that of the short-circuit current when illuminated through the aluminium. The broken line is the normalised absorption spectrum of PPV and is shown for comparison. The response of the diode when illuminated though the aluminium is slightly different than that when illuminated through the ITO with a 1.5 V bias applied, with the high photon-energy response slightly stronger, and with more ribtonic structure visible.

Figure 12:
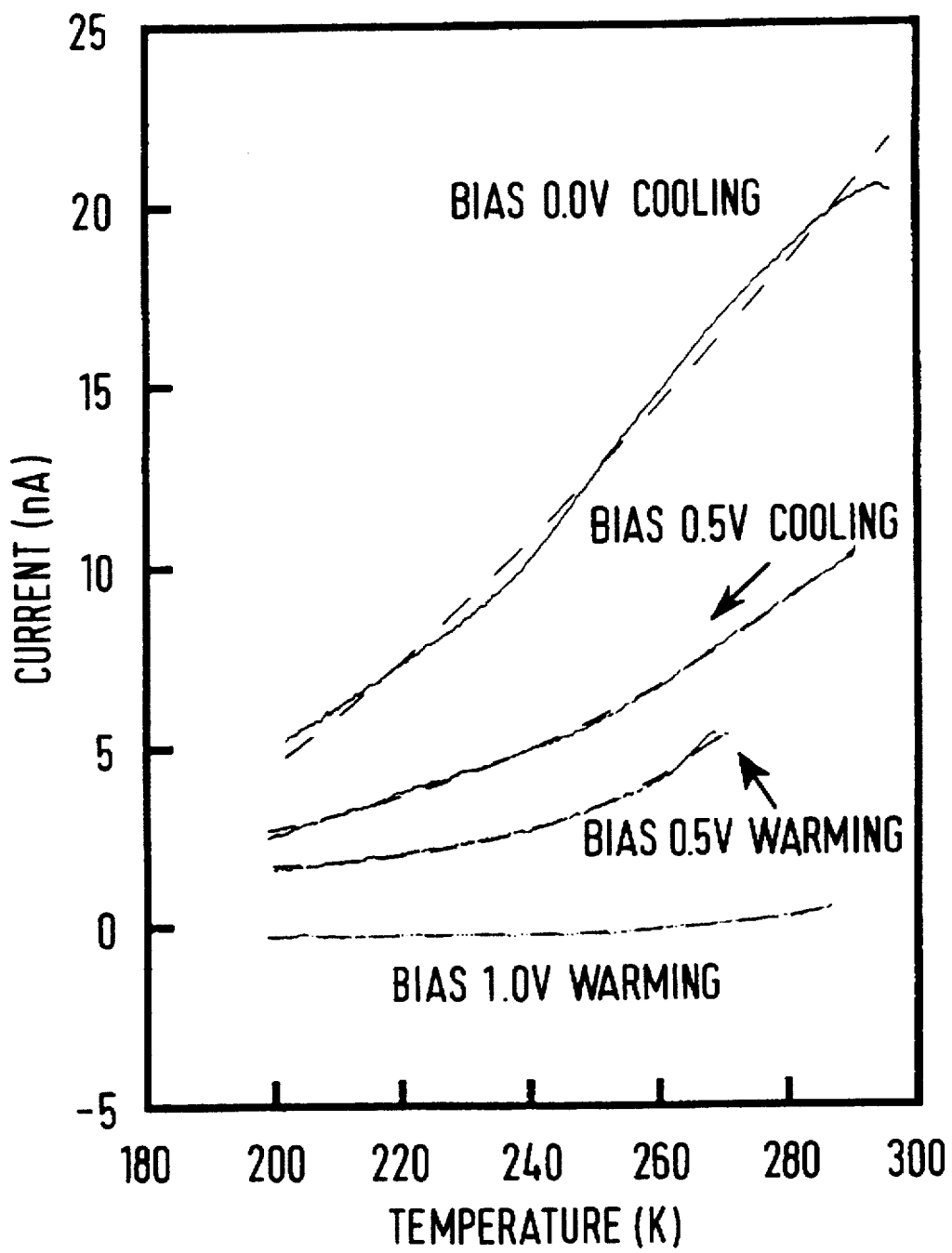
FIG. 12 shows the variation of photocurrent at different biases.
Figure 13:
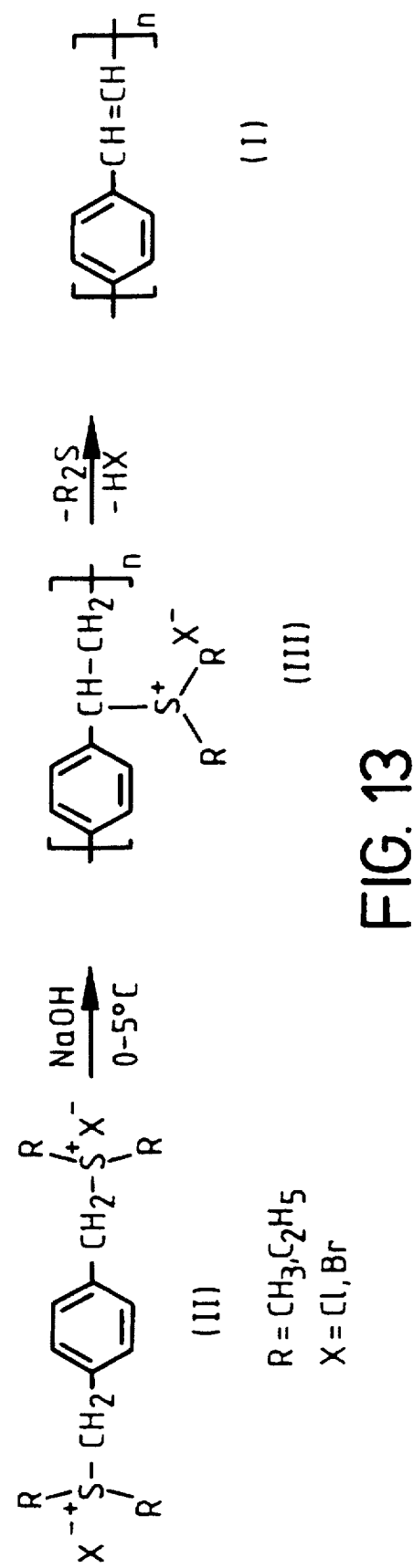
FIG. 13 illustrates a precursor reaction.

FIG. 12 shows the variation of short-circuit photocurrent of a 130 nm device with temperature, for several biases. The solid lines are experimental data, and the broken lines are exponential curve fits to these data. The devices were illuminated at 496.5 nm, and were cooled at a rate of approximately 0.5 K/min⁻¹. The curves show an approximate Arrhenius form $J \exp(-E_A/kT)$, with a bias dependent activation energy $E_A$. The activation energies obtained were 0.067 eV (0.0V bias, cooling), 0.12 eV (0.5 V bias, cooling), 0.22 eV (0.5 V bias, warming), and 0.36 eV (1.0 V bias, warming). The two different activation energies at a bias of 0.5 V indicate that the cooling or heating may not have been at equilibrium. Measurements of the temperature dependence of the short-circuit current were made for two ITO-PPV-Mg devices, with thicknesses 1300 A and 500 A. These gave activation energies of 0.058 eV and 0.036 eV respectively. p The generation of substantial photocurrents end large open-circuit voltages in these photodiodes indicates that charge generation following photoexcitation is an important process in semiconductive conjugated polymers such as PPV.

The spectral response is limited by a competition process between the amount of light absorbed and the location of the absorption region within the PPV layer, and the photocurrent peaks at a photon energy that balances these two factors. The thickness of the PPV strongly affects the position of the peak. As the film thickness drops, the high energy photon response will improve, so that the photocurrent peaks at photon energy such that the absorption depth in the PPV is approximately equal to the thickness of the PPV film. Reducing the polymer layer thickness will also increase the internal electric field in the polymer under short-circuit conditions, and this will further increase the photoconductive gain.

When the polarity of the internal field is reversed by the application of a sufficiently large positive bias, the spectral response changes, as is Seen very clearly as the bias is raised from 1 V to 1.5 V for the ITO/PPV/Mg device shown in FIGS. 7 and 8, and for the ITO/PPV/Al device shown in FIG. 11. At 1.5 V bias, electrons now leave the PPV through the ITO interface, and so it is advantageous for the light to be absorbed close to the ITO interface. Holes are more mobile than the electrons, so a much larger proportion of the photoexcited holes reach the opposite metal electrode. Therefore the response at higher photon energies is improved when the electric field in the device is reversed. The position of the peak in the response also shifts towards high energies, for the same reason.

The shape of the I/V curves in PPV devices is very different to those of conventional photodiodes, such as those made with silicon in which the photocurrent is superposed on the dark I/V curve, since the photocarrier generation efficiency is largely insensitive to the applied bias. In PPV devices, the inventors have postulated that the carrier generation results from ionisation of excitons in the bulk of the polymer, so the generation efficiency is dependent on the electric field present within the PPV. When short-circuited, the reverse bias field inside the PPV is the open-circuit voltage divided by the thickness of the polymer later, and will be of order $10^5$ V/cm⁻¹ in the devices described herein. The carrier generation efficiency is smallest when a positive bias is applied to the diode to give a flat-band condition inside the PPV, but will then rise as the device is taken into forward bias, as evident in FIG. 2.

The discovery of the large increase in current under large bias voltages, both forward and reverse forms the basis for the present invention. The photoconductive gain can exceed unity (see FIG. 5) even though the efficiency of generation of charge carrier pairs from each photon absorbed in the PPV layer is considerably less than unity. This high photoconductive gain indicates that the lifetime for the more mobile photocarrier (here this will be the holes) is greatly in excess of the transit time of these carriers across the device. The charge pair generation efficiency is probably not much larger than the figure of 1% for the photovoltaic quantum efficiency, and therefore the lifetime of the photogenerated electrons in the PPV layer could be very considerable. During the lifetime of these electrons, holes can transit across the polymer layer, under forward bias towards the Al, Mg or Ca electrode, and reappear back at the ITC electrode, be re-injected and transit again the polymer layer.

The temperature dependence of the photocurrent provides a measure of its activation energy, which was found to be bias dependent, as shown in FIG. 12. As the applied bias increases from 0 V the internal field drops, because the short-circuit field is in reverse bias. As the internal field drops, the activation energy of the photocurrent rises. When the applied bias is extrapolated to zero internal field, the activation energy is 0.4 ev. This may correspond to the binding energy of the exciton in PPV.

The appearance of an enhanced photoconductive response under both forward and reverse bias for these polymer-based diodes was unexpected, since there was no prior anticipation that the necessary combination of carrier mobilities, carrier photogeneration efficiencies, recombination lifetimes etc. would be met in these devices. Such levels of photoconductive gain give diodes of this type a very useful level of performance as photodetectors, with the particular advantage that they can be fabricated as a number of independent pixels over a large area (as indicated also for the picellation of a graphic display based on polymer LEDs, see "Electroluminescent Devices and Their Manufacture", R. H. Friend, J. M. Burroughes and D.D.C. Bradley, U.S. Pat. No. 5,247,190. Furthermore, these devices are unique in combining (i) think-film fabrication, (ii) use of polymers as active semiconductors, and (iii) LED and PC or PV characteristics in the same device.

What is claimed is:

1. A photodetector device comprising:
    a semiconductive conjugated polymer layer arranged between first and second electrode layers having different work functions;
    bias circuitry connected to apply a bias voltage between said first and second electrode layers; and
    sensing circuitry connected to detect a photocurrent flowing between said first and second electrode layers across said polymer layer as a result of radiation incident on said polymer layer while said bias voltage is applied, said bias voltage being selected in relation to the thickness of the polymer layer so that the bias voltage divided by the thickness of the polymer layer exceeds $10^5$ vcm$^{-1}$, whereby the quantum efficiency of the device exceed 30%.

2. A photodetector device according to claim 1 wherein the bias voltage is selected so that the quantum efficiency exceeds 70%.

3. A photodetector device according to claim 1 wherein the bias voltage is applied in the forward direction.

4. A photodetector device according to claim 1 wherein the bias voltage is applied in the reverse direction.

5. A photodetector device according to claim 1 wherein the bias voltage is selected in relation to the thickness of the polymer layer so that the bias voltage divided by the thickness of the polymer layer exceeds $2.5\times10^5$ Vcm$^{-1}$.

6. A photodetector device according to claim 1 wherein the semiconductive conjugated polymer layer comprises poly(p-phenylene vinylene).

7. A photodetector device according to claim 1 wherein the semiconductive conjugated polymer layer is a film having a thickness of about 100 nm.

8. A photodetector device according to claim 1 wherein the first electrode layer is indium tin oxide and the second electrode layer is selected from the group comprising aluminium, magnesium and calcium.

9. A method of detecting radiation comprising the steps of:
    applying a bias voltage to first and second electrode layers having different work functions and between which is arranged a semiconductive conjugated polymer layer;
    directing radiation to be detected onto said polymer layer while said bias voltage is applied; and
    sensing a photo-current flowing between said first and second electrode layers across said polymer layer, wherein the bias voltage is selected in relation to the thickness of the polymer layer so that the bias voltage divided by the thickness of the polymer layer exceeds $10^5$ V cm$^{-1}$, whereby the quantum efficiency of the device exceeds 30%.

10. A method of detecting radiation according to claim 9 wherein the bias voltage is selected so that the quantum efficiency exceeds 70%.

11. A method of detecting radiation according to claim 9 wherein the bias voltage is selected in relation to the thickness of the polymer layer so that the bias voltage divided by the thickness of the polymer layer exceeds $2.5\times10^5$ Vcm$^{-1}$.

12. A method of detecting radiation according to claim 9 wherein the step of applying a bids voltage comprises applying a forward bias voltage.

13. A method of detecting radiation according to claim 9 wherein the step of applying a bias voltage comprises applying a reverse bias voltage.

14. A method of using an electroluminescent device as a photodetector, the electroluminescent device comprising:
    a semiconductive conjugated polymer layer;
    a first contact layer arranged on one side of the semiconductive conjugated polymer layer selected so that on application of an electric field to said device charge carriers of a first type are injected into the semiconductive conjugated polymer layer; and
    a second contact layer arranged on the other side of the semiconductive conjugated polymer layer selected so that on application of an electric field to said device charge carriers of a second type are injected into the semiconductive conjugated polymer layer, the semiconductive conjugated polymer layer having a sufficiently low concentration of extrinsic charge carriers that on applying an electric field between the first and second contact layers so as to render the second contact layer positive relative to the first contact layer, charge carriers of said first and second types are injected into the semiconductive conjugated polymer layer and combine to form charge carrier pairs which decay radiatively so that radiation is emitted from said semiconductive conjugated polymer layer, said method comprising:
    applying a bias voltage between the first and second contact layers while directing radiation onto said semiconductive conjugated polymer layer and sensing a photo-current flowing in said device as a result of said radiation, wherein the bias voltage is selected in relation to the thickness of the semiconductive conjugated polymer so that the bias voltage divided by the thickness of the polymer layer exceeds $10^5$ vcm$^{-1}$, whereby the quantum efficiency of the device exceeds 30%.

15. A method according to claim 14 wherein the bias voltage is selected so that the quantum efficiency exceeds 70%.

16. A method according to claim 14 wherein the bias voltage is selected in relation to the thickness of the semiconductive conjugated polymer layer so that the bias voltage divided by the thickness of the polymer layer exceeds $2.5 \times 10^5$ Vcm$^{-1}$.

17. A method of manufacturing a photodetector device comprising a layer of semiconductive conjugated polymer between first and second electrode layers, comprising the steps of:

a) putting down one of said first and second electrode layers:

b) depositing on said electrode layer a layer of semiconductive conjugated polymer;

c) providing the other one of said first and second electrode layers; and d) connecting to said first and second electrode layers circuitry for generating a bias voltage and sensing a photo-current when the device is illuminated, wherein the bias voltage is selected in relation to the thickness of the polymer layer so that the bias voltage divided by the thickness of the polymer layer exceeds $10^5$ vcm$^{-1}$, whereby the quantum efficiency of the device exceeds 30%.

18. A method according to claim 17 wherein step b) is carried out by depositing a layer of a precursor polymer as a polymer film and then heating the deposited precursor polymer to a high temperature to form the semiconductive conjugated polymer layer.

19. A method according to claim 17 wherein the bias voltage is selected so that the quantum efficiency of the device exceeds 70%.

20. A method according to claim 17 wherein the bias voltage is selected in relation to the thickness of the polymer layer so that the bias voltage divided by the thickness of the polymer layer exceeds $2.5 \times 10^5$ Vcm$^{-1}$.

* * * * *

UNITED STATES PATENT AND TRADEMARK OFFICE
CERTIFICATE OF CORRECTION

PATENT NO. : 5,523,555
DATED : June 4, 1996
INVENTOR(S) : Friend et al.

It is certified that error appears in the above-indentified patent and that said Letters Patent is hereby corrected as shown below:

Col. 1, line 39 "Dyak ahoy" should read --Dyakanov--

Col. 2, line 10 "Of" should read --of--

Col. 2, line 31 "polythlophenes" should read --polythiophenes--

Col. 2, line 66 insert --a-- after the word "provided"

Col. 3, line 10 insert --is-- after the word "there"

Col. 3, line 52 "$2.5 \times 10^5$vcm" should read --$2.5 \times 10^5$Vcm--

Col. 4, line 43 "vinylone" should read --vinylene--

Col. 4, line 67 insert --of:-- after the word "steps"

Col. 6, line 65 "end/or" should read --and/or--

Col. 7, line 12 "Poly(Phenylenevinylene)" should read --poly(phenylenevinylene)--

Col. 7, line 13 insert --is-- after the word "it"

Col. 7, line 14 "e" should read --a--

Col. 7, line 33 "2.5ev" should read --2.5eV--

UNITED STATES PATENT AND TRADEMARK OFFICE
CERTIFICATE OF CORRECTION

PATENT NO. : 5,523,555

DATED : June 4, 1996

INVENTOR(S) : Friend et al.

It is certified that error appears in the above-indentified patent and that said Letters Patent is hereby corrected as shown below:

Col. 7, line 40 "sylphonium" should read --sulphonium--

Col. 7, line 56 "diane" should read --diene--

Col. 7, line 67 "vinylone" should read --vinylene--

Col. 8, line 6 "vinylone" should read --vinylene--

Col. 8, line 40 "is" should read --as--

Col. 8, line 48 "ITo" should read --ITO--

Col. 9, line 55 "Keithlay" should read --Keithley--

Col. 9, line 56 "Keithlay" should read --Keithley--

Col. 10, line 35 "Clearly" should read --clearly--

Col. 11, line 5 "mw/cm$^2$" should read --mW/cm$^2$--

Col. 12, line 8 delete "p" after the word "respectively"

Col. 12, line 8 "end" should read --and--

Col. 12, line 28 "Seen" should read --seen--

Col. 12, line 50 "later" should read --layer--

UNITED STATES PATENT AND TRADEMARK OFFICE
CERTIFICATE OF CORRECTION

PATENT NO. : 5,523,555
DATED : June 4, 1996
INVENTOR(S) : Friend et al.

It is certified that error appears in the above-indentified patent and that said Letters Patent is hereby corrected as shown below:

Col. 12, line 51 "$10^5$V/cm$^{-1}$" should read --$10^5$Vcm$^{-1}$--

Col. 13, line 13 "0.4ev" should read --0.4eV--

Col. 13, line 29 "think" should read --thick--

Col. 13, line 47 "$10^5$ vcm$^{-1}$" should read --$10^5$ Vcm$^{-1}$--

Col. 14, line 15 "$10^5$ V cm$^{-1}$" should read --$10^5$ Vcm$^{-1}$--

Col. 14, line 26 "bids" should read --bias--

Col. 14, line 63 "$10^5$ vcm$^{-1}$" should read --$10^5$ Vcm$^{-1}$--

Col. 16, line 3 "$10^5$ vcm$^{-1}$" should read --$10^5$ Vcm$^{-1}$--

Signed and Sealed this

Tenth Day of December, 1996

Attest:

Attesting Officer

BRUCE LEHMAN
Commissioner of Patents and Trademarks